(12) United States Patent
Kuwajima et al.

(10) Patent No.: US 7,589,416 B2
(45) Date of Patent: Sep. 15, 2009

(54) SUBSTRATE, ELECTRONIC COMPONENT, AND MANUFACTURING METHOD OF THESE

(75) Inventors: Hajime Kuwajima, Tokyo (JP); Masashi Gotoh, Tokyo (JP)

(73) Assignee: TDK Corporation, Tokyo (JP)

( * ) Notice: Subject to any disclaimer, the term of this patent is extended or adjusted under 35 U.S.C. 154(b) by 160 days.

(21) Appl. No.: 11/420,219

(22) Filed: May 24, 2006

(65) Prior Publication Data

US 2006/0270095 A1     Nov. 30, 2006

(30) Foreign Application Priority Data

May 26, 2005   (JP)   ............... 2005-154087

(51) Int. Cl.
*H01L 23/12*   (2006.01)
*H01L 23/053*   (2006.01)

(52) U.S. Cl. ............... 257/700; 257/E23.003

(58) Field of Classification Search ............... 257/700
See application file for complete search history.

(56) References Cited

FOREIGN PATENT DOCUMENTS

| | | |
|---|---|---|
| JP | 05-335713 | 12/1993 |
| JP | 05-343828 | 12/1993 |
| JP | 08-181450 | 7/1996 |
| JP | 11-054870 | 2/1999 |
| JP | 2002-043741 | 2/2002 |
| JP | 2003-110211 | 4/2003 |
| JP | 2004-128177 | 4/2004 |
| JP | 2005-019918 | 1/2005 |
| JP | 2005-311183 | 11/2005 |

OTHER PUBLICATIONS

Office Action, Japanese Patent Application No. 2005-154087, dated Aug. 12, 2008.
Office Action, Japanese Patent Application No. 2005-063464, dated Aug. 12, 2008.

*Primary Examiner*—David A Zarneke
(74) *Attorney, Agent, or Firm*—Baker & McKenzie LLP

(57) ABSTRACT

To fill a conductive material in an opening portion formed in a base of an electronic component, a groove is formed to surround an opening in an upper conductor, and the upper conductor is divided into a first conductive portion and a second conductive portion surrounding the first conductive portion. A mask is formed such that a conductor to be filled in the opening portion may not contact the second conductive portion. Metal plate is grown from the side of a lower conductor in the opening portion by using the lower conductor as electrode to fill the opening portion with metal plate. The metal plate filled in the opening portion and the upper conductor are joined by plating by using the upper conductor or the lower conductor as electrode.

6 Claims, 13 Drawing Sheets

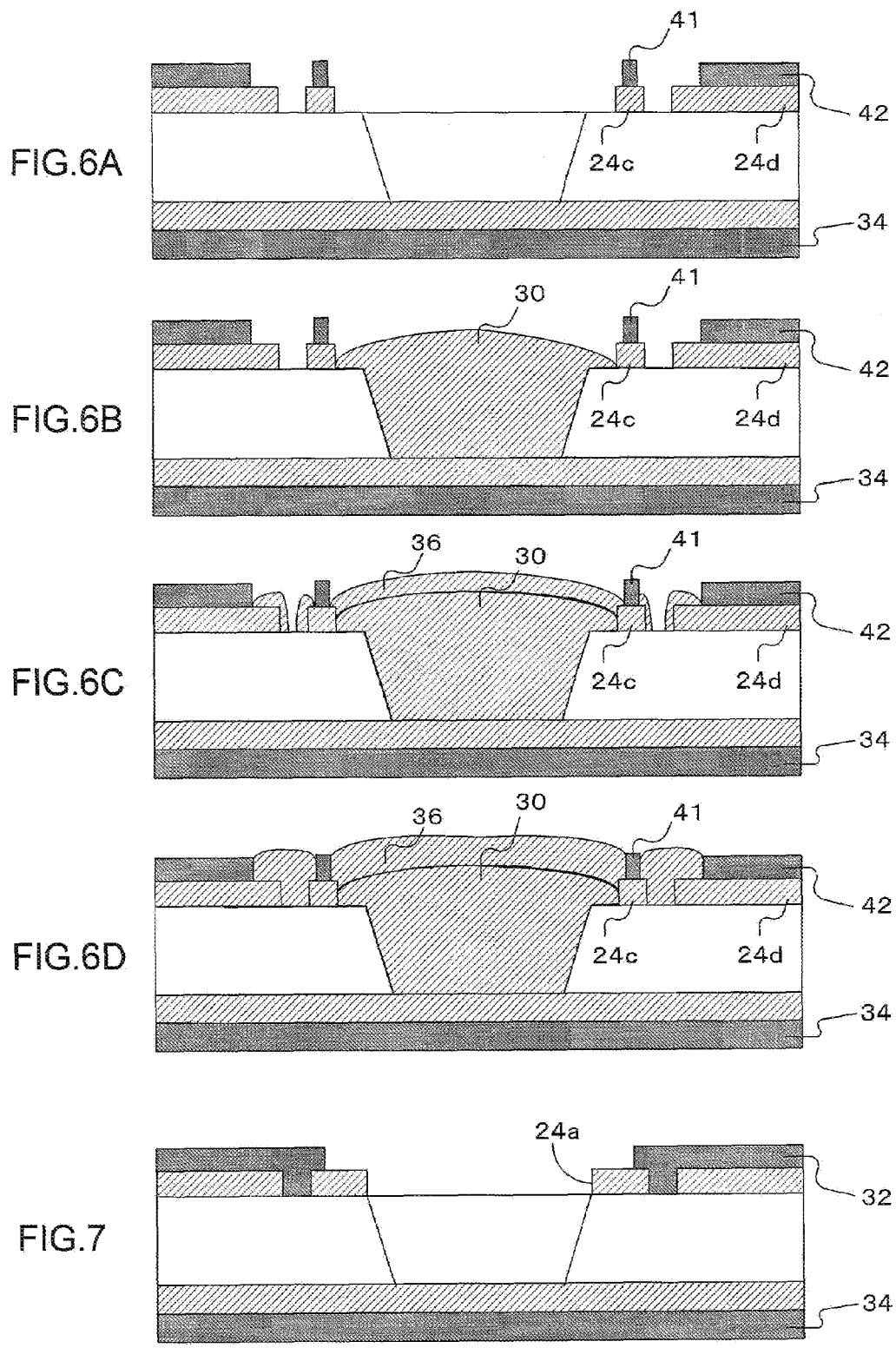

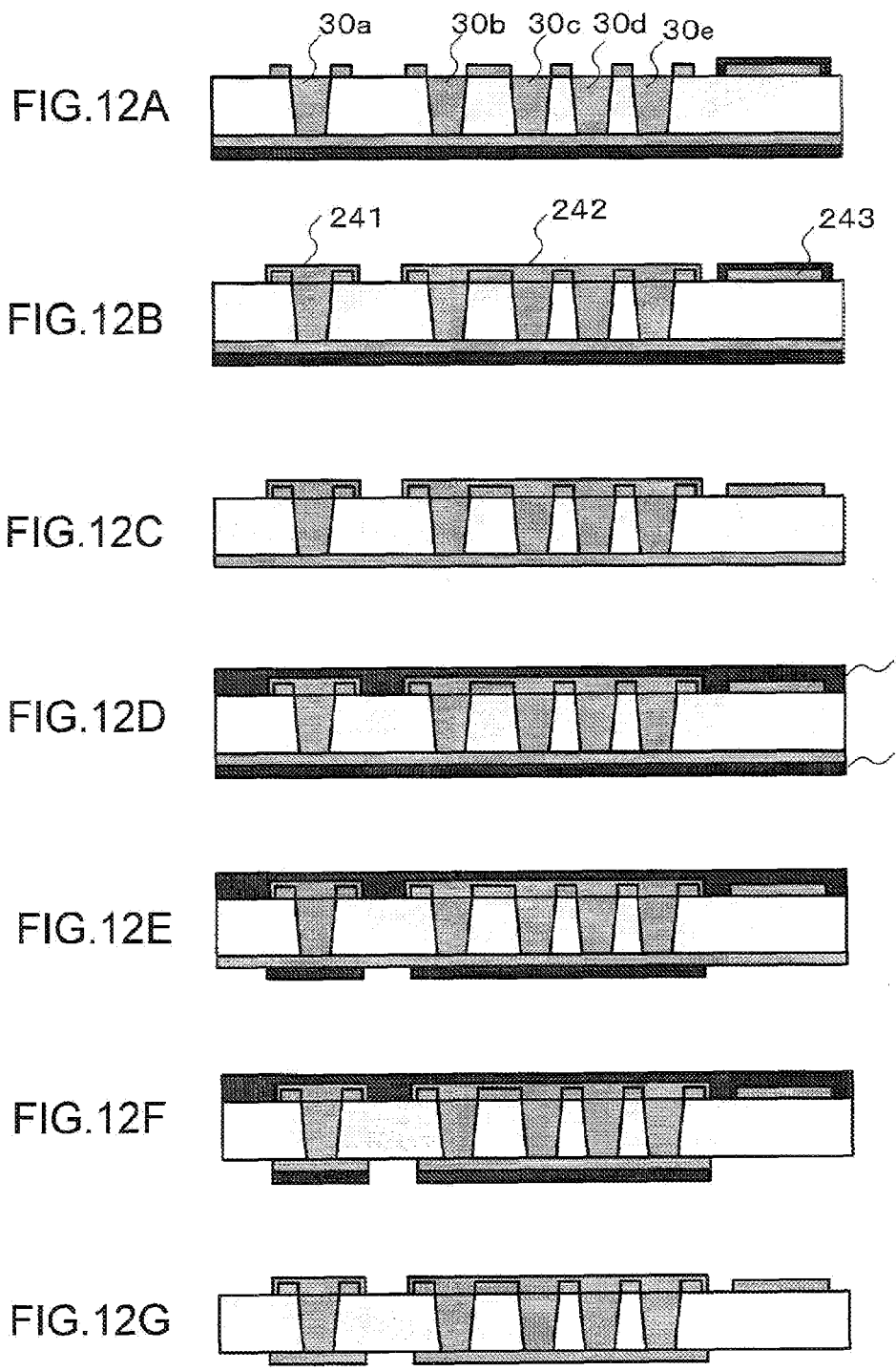

SUBSTRATE, ELECTRONIC COMPONENT, AND MANUFACTURING METHOD OF THESE

CROSS-REFERENCE TO RELATED APPLICATIONS

This application claims the benefit of Japanese patent application no. 2005-154087, filed May 26, 2005, which is commonly assigned with the present application and incorporated herein by reference for all purposes. The contents of Japanese patent application no. 2005-063464 are also incorporated herein by reference for all purposes.

BACKGROUND OF THE INVENTION

1. Field of the Invention

The present invention relates to a substrate, an electronic component, and a manufacturing method of these.

2. Description of the Related Art

There has conventionally been known an electronic component manufactured by forming a conductive portion in a substrate (single-layer board) so as to penetrate a base of the substrate, which comprises the base made of an insulating material and conductive layers formed on the upper and lower surfaces of the base, and by stacking such single-layer boards, in which the conductive portion is formed, and connecting the single-layer plates (interlayer connection). The conductive portion in the single-layer boards used in this type of electronic component is formed by, for example, a method described below. FIG. 16 and FIG. 17 are diagrams for explaining the steps of forming the conductive portion of the single-layer boards.

First, a base 1 made of an insulating material is prepared, which has a predetermined thickness, on whose upper surface a conductive film 2 is formed, and on whose lower surface a lower conductive layer 3 is formed. A dry film 6 to serve as a resist is adhered to the base 1 so as to cover the conductive film 2, and then subjected to exposure and development, thereby to form a hole 7 corresponding to the diameter of a later-described conductive portion, as shown in FIG. 16A. Next, the conductive film 2 exposed at the bottom of the hole 7 is etched to remove the conductive film 2 exposed in the hole 7, and to expose the base 1 as shown in FIG. 16B. After the base 1 is exposed at the bottom of the hole 7, the dry film 6 is separated and an opening portion 8 corresponding to the diameter of the hole 7 is formed by laser irradiation to expose the lower conductive layer 3, as shown in FIG. 16C. Then, after the exposed surface of the lower conductive layer 3 and the formed opening portion 8 are subjected to desmear and these surfaces are cleaned, nonelectrolytic plating, which uniformly becomes chemical plating, is applied to the upper layer side of the substrate 1 and to the opening portion 8 to form a nonelectrolytic plated layer 9, as shown in FIG. 16D.

After the nonelectrolytic plated layer 9 is formed, electrolytic plating is applied with the nonelectrolytic plated layer 9 used as a power feeding film (electrode), to deposit a metal 10 inside the opening portion 8 and on the conductive film 2 as shown in FIG. 17A. Then, after the inside of the opening portion 8 is filled with the metal 10 by electrolytic plating as shown in FIG. 17B, the conductive film 2 and the lower conductive layer 3 are patterned by a subtractive method to form an upper wiring pattern 4 and a lower wiring pattern 5, and a conductive portion 11 is formed in the opening portion 8, as shown in FIG. 17C.

Further, as a method for forming a conductive portion of a single-layer board, also known are, for example, a method of using a nonelectrolytic plated layer at the bottom of a through hole to improve the air tightness between the base and the conductive portion, with reference to Unexamined Japanese Patent Application KOKAI Publication No. H5-335713, and a method of applying other treatments instead of nonelectrolytic plating, with reference to Unexamined Japanese Patent Application KOKAI Publication No. 2003-110211.

However, when electrolytic plating is applied after the nonelectrolytic plated layer 9 is formed to fill the opening portion with the metal 10, the plated layers are formed thick on the entire surface of one side of the base 1 because the nonelectrolytic plated layer 9 and the metal 10 are formed on the conductive film 2. This decreases the pattern etching performance, and the cross section of the wiring pattern becomes trapezoidal as shown in FIG. 17C when the wiring pattern is formed by etching, causing problems that the accuracy of the dimensions is reduced and a wiring pattern with narrow widths cannot be formed.

Furthermore, when the nonelectrolytic plated layer 9 is formed and electroplating is applied with the nonelectrolytic plated layer 9 used as an electrode, fresh plating solution is applied more to the surface of the nonelectrolytic plated layer 9 than to the inside of the opening portion. This promotes the growth of the electroplated layer on the surface, blocking the opening portion 8 with the electroplated layer before the metal 10 is filled in the opening portion 8, and possibly producing an empty space (so-called void) inside the conductive portion 11.

The same problem might occur even in a case where another pretreatment is applied, without using nonelectrolytic plating.

In a case where nonelectrolytic plating as the pretreatment of electroplating or another pretreatment similar to nonelectrolytic plating (hereinafter these will be referred to as nonelectrolytic plating, etc.) is used, a metal catalyst is used in order to adhere plate to also other portions (insulating portions) than the conductive portion. However, if the metal catalyst remains on the surface of the wiring layer, troubles such as a decrease of the insulating resistance, a short circuit in the wiring pattern, etc. might be caused. Particularly, recent electronic components adopt narrower pitches, and the possibilities of such troubles are more and more increased.

SUMMARY OF THE INVENTION

To solve these problems, the applicant has proposed a method of forming, from the side of the conductive film, an opening portion bottomed by the lower conductive layer in a region where the conductive portion is to be formed, growing metal plate from the bottom of the opening portion by using the lower conductive layer as an electrode, and when the metal plate reaches the conductive film to finish forming the conductive portion in the opening portion, growing metal plate on the conductive film and on the conductive portion by using the conductive film and the conductive portion as the electrode until the metal plate becomes thick enough to form an upper conductive layer (see Unexamined Japanese Patent Application KOKAI Publication No. 2005-19918).

Since according to this method the step of nonelectrolytic plating, etc., can be eliminated, it is possible to achieve simplification of the manufacturing steps. Further, as the conductive film is used as the so-called stopper, even if a plurality of opening portions have uneven volumes, the instant the conductive portions become electrically continuous to the conductive film, the electrode area increases and the current density greatly drops along with this. Therefore, the speed of deposition of the plate decreases and influences on the plating height can be suppressed, even if the opening portions have the varied volumes.

If the substrate size is enlarged, the number of opening portions (via holes) formed in the substrate increases along with this size alteration. If the number of opening portions increases, the unevenness of the opening portions becomes greater, which will lead to, in the process of the lower conductive layer and the conductive film being connected by plating, an insufficient deposition of plate and inadequate filling of plate in some opening portions where the conductive portion and the conductive film have not yet contacted, when the conductive portion and the conductive film have contacted faster in any other opening portions. This is because the regions including their neighborhood, where the conductive portion and the conductive film contact faster, bring about the concentration of current density and decrease the current supply to the opening portions around them. Thus, the distribution of the current to be supplied to each opening portion becomes uneven and the rate of plate deposition becomes varied. This will result in an insufficient deposition, deposition with an empty space, or uneven heights of plate deposits. In such a case, various measures may be taken such as to increase the time to apply plating, to increase the amount of current supply, to change the composition of the plating solution, etc. However, it is difficult to fill the plate in all the opening portions uniformly.

In such a case as described above, it is conceivable to use the conductive film as the so-called stopper as taught in Unexamined Japanese Patent Application KOKAI Publication No. 2005-19918 mentioned above. However, this method might suppress the growth of the conductive portion that has not yet contacted the conductive film, and cannot have been an effective method in a case where there are many opening portions. Furthermore, in a case where the shapes of the opening portions are un-uniform or the shapes of the opening portions are different, there is a risk that the lower conductive layer and the conductive film may not be connected to each other in some regions. Hence, there is a demand for a substrate and an electronic component having a high electrical reliability, and for a manufacturing method of a substrate and an electronic component, which has a high electrical reliability and is more efficient.

Furthermore, if the opening portions have a recessed shape, the performance of soldering an electronic component at the opening portions is low, and a bonding defect might be produced in a case where a semiconductor element is attached to the substrate directly by flip-chip packaging. In addition, if the opening portions have a recessed shape, stacked substrates will have the recessed portions of the lower substrate remaining inside and in the surface of the substrates, resulting in a bonding defect in dealing with multilayering. Furthermore, if the opening portions have a recess, such a trouble, in addition to deterioration of electric properties, as lowered heat conductivity is also caused, which will impede the radiation performance and ultimately lead to the deterioration of electric properties and product life. Hence, it is demanded to make the substrate suitable for flip-chip packaging of elements and for multilayering, and to make the substrate have a higher density, a smaller size, a higher radiation performance, and a higher connection reliability, by filling the opening portions with plate to make the substrate flat.

The present invention was made in view of the above-described problems, and an object of the present invention is to provide a manufacturing method of a substrate and an electronic component, which method does not involve a step of nonelectrolytic plating, etc., has a high electric reliability, and is efficient.

Another object of the present invention is to provide a substrate and an electronic component which have a high electric reliability.

Yet another object of the present invention is to provide a substrate and an electronic component which have a high density and multiple opening portions and which are suitable for downsizing, moduling, densifying, and a manufacturing method of these.

To achieve the above objects, a manufacturing method of a substrate according to a first aspect of the present invention comprises:

a conductive portion forming step of forming a plurality of conductive portions electrically insulated from each other, by forming an insulating groove in a first conductive member having an opening; and a metal plate filling step of, after the plurality of conductive portions are formed at the conductive portion forming step, filling metal plate in an opening portion, which is formed so as to penetrate a first insulating member sandwiched between the first conductive member and a second conductive member from the opening in the first conductive member to a side of the second conductive member, by performing electroplating to grow the metal plate from the side of the second conductive member in the opening portion of the first insulating member, by using the second conductive member as a power feeding electrode for the electroplating.

According to this configuration, since after a plurality of conductive portions are formed, metal plate is grown by electroplating from the side of the second conductive member in the opening portion in the first insulating member to fill the metal plate in the opening portion of the first insulating member, the plating current density does not change abruptly, and plate filling can be performed stably. Accordingly, it is possible to provide a substrate and an electronic component having a high electric reliability. Further, it is possible to efficiently fill plate in the opening portion. Furthermore, since no nonelectrolytic plating step is performed, the manufacturing process can be simplified. Therefore, it is possible to prevent remaining of a metal catalyst, etc., which is used in a nonelectrolytic plating step, and to improve the electric reliability of the electronic component.

It is preferred that at the conductive portion forming step, the first conductive member be divided into a first conductive portion formed by the groove surrounding the opening in the first conductive member, and a second conductive portion which does not include the opening in the first conductive member. For example, at the conductive portion forming step, the second conductive portion is formed so as to surround the first conductive portion.

It is preferred that at the conductive portion forming step, the first conductive portion be formed so as to be smaller than the second conductive portion.

At the conductive portion forming step, the insulating groove may be formed in the first conductive member such that the plurality of conductive portions to be formed have a wiring pattern.

The method may further comprise a connecting step of, after the metal plate is filled in the opening portion at the metal plate filling step, electrically connecting the plurality of conductive portions by filling metal plate in the insulating groove formed in the first conductive member by using the first conductive member or the second conductive member as a power feeding electrode for electroplating.

The method may further comprise:

an insulating member forming step of, after the plurality of conductive portions are formed at the conductive portion forming step, forming a second insulating member in the insulating groove such that the plurality of conductive portions are not electrically connected; and an insulating member removing step of removing the second insulating member, after the metal plate is filled in the opening portion at the metal plate filling step, and at the metal plate filling step, the metal plate may be filled in the opening portion, after the second insulating member is formed in the insulating groove at the insulating member forming step.

At the insulating member forming step, the second insulating member may be formed so as to completely cover the second conductive portion.

At the conductive portion forming step, the insulating groove may be formed such that a width of the groove is twice to twenty times as large as a thickness of the first conductive member.

The opening portion in the first insulating member may be formed so as to be smaller than the opening in the first conductive member and to have a predetermined distance from the opening in the first conductive member.

The method may further comprise a cleaning step of cleaning the opening portion and a surface of the second conductive member that is exposed in the opening portion, before the metal plate is filled in the opening portion at the metal plate filling step.

A manufacturing method of an electronic component according to a second aspect of the present invention comprises:

a conductive portion forming step of forming a plurality of conductive portions electrically insulated from each other, by forming an insulating groove in a first conductive member which is included in a substrate comprising the first conductive member having an opening, a second conductive member, and a first insulating member sandwiched between the first and second conductive members;

a metal plate filling step of, after the plurality of conductive portions are formed at the conductive portion forming step, filling metal plate in an opening portion, which is formed so as to penetrate the first insulating member from the opening in the first conductive member to a side of the second conductive member, by performing electroplating to grow the metal plate from the side of the second conductive member in the opening portion of the first insulating member, by using the second conductive member as a power feeding electrode for the electroplating; and a stacking step of stacking the substrate, whose opening portion in the first insulating member has been filled with the metal plate.

A substrate according to a third aspect of the present invention comprises:

a first conductive member, comprising a plurality of conductive portions electrically insulated from each other by an insulating groove, and having an opening;

a second conductive member; and a first insulating member, sandwiched between the first conductive member and the second conductive member, having an opening portion formed therein so as to penetrate therethrough from the opening in the first conductive member to a side of the second conductive member, and having metal plate filled in the opening portion from the side of the second conductive member in the opening portion, by electroplating performed by using the second conductive member as a power feeding electrode for the electroplating.

According to this invention, an opening portion can securely be filled with a conductive material even in a substrate having many opening portions (these opening portions may be different in size and in shape), allowing the substrate to have a high connection reliability. Therefore, the opening portion can be used as an opening portion for connecting wires in a signal transmission system, connecting wires in a ground system, connecting wires between ground and an electromagnetic shield, and connecting wires in a power supply system, and furthermore can be used for a developed application as a radiation fin.

The first conductive member may comprise a first conductive portion formed by the groove surrounding the opening in the first conductive member, and a second conductive portion that does not include the opening of the first conductive member. For example, the second conductive portion may be formed so as to surround the first conductive portion.

It is preferred that the first conductive portion be formed so as to be smaller than the second conductive portion.

It is preferred that the first conductive member be formed such that the plurality of conductive portions to be formed have a wiring pattern.

An electronic component according to a fourth aspect of the present invention comprises substrates stacked together, each substrate comprising a first conductive member having an opening, a second conductive member, and a first insulating member sandwiched between the first and second conductive members, wherein an opening portion is formed so as to penetrate the first insulating member from the opening in the first conductive member to a side of the second conductive member, the first conductive member comprises a plurality of conductive portions which are electrically insulated from each other by an insulating groove, and metal plate is filled in the opening portion in the first insulating member from the side of the second conductive member in the opening portion of the first insulating member, by electroplating using the second conductive member as a power feeding electrode for the electroplating.

BRIEF DESCRIPTION OF THE DRAWINGS

These objects and other objects and advantages of the present invention will become more apparent upon reading of the following detailed description and the accompanying drawings in which:

FIG. 6A to FIG. 6D are diagrams for explaining a manufacturing process of a single-layer board according to another embodiment;

FIG. 7 is a diagram showing a structure of a single-layer board according to another embodiment;

FIG. 12A to FIG. 12G are diagrams for explaining the manufacturing process of the single-layer board of FIG. 10;

DETAILED DESCRIPTION OF THE PREFERRED EMBODIMENT

Figure 1:
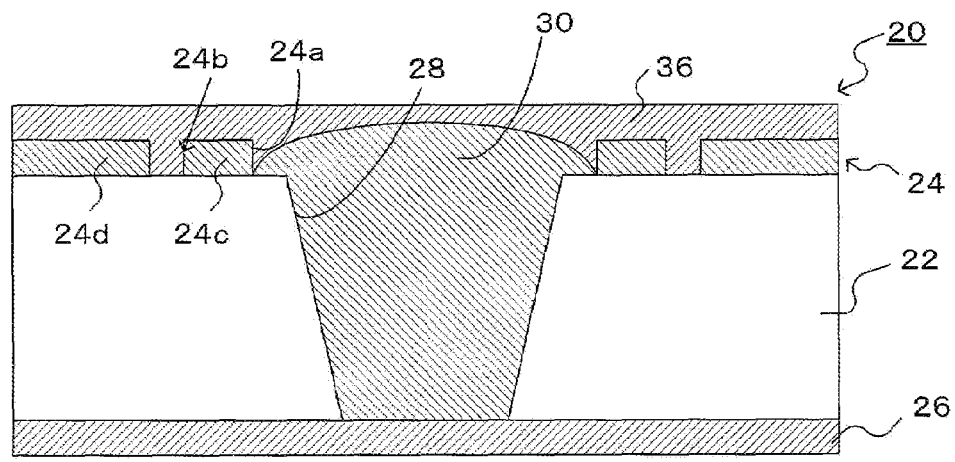
FIG. 1 is a diagram showing a structure of a single-layer board according a first embodiment of the present invention.

The substrate and electronic component, and manufacturing method of these, according to the present invention will be explained below with reference to the drawings. FIG. 1 is a cross-sectional view showing the structure of a substrate constituted by a single-layer board according to an embodiment.

As shown in FIG. 1, the single-layer board (substrate) 20 comprises a base (first insulating member) 22, an upper conductor (first conductive member) 24, a lower conductor (second conductive member) 26, a conductive portion 30, and a conductive portion 36.

The base 22 is constituted by an insulating member having a predetermined thickness. An insulating resin substrate of various kinds, a ceramic substrate, etc. can be used as the base 22.

An opening portion 28, whose bottom is constituted by the lower conductor 26, is formed in the base 22 so as to penetrate through the base 22. The opening portion 28 is formed so as to have its diameter increased from the side of the lower surface of the base 22 (the side of the lower conductor 26) to the side of the upper surface of the base 22 (the side of the upper conductor 24). With this increasing diameter, it becomes easy for the plating material to enter the opening portion 28 and it becomes harder for a void to be produced inside the conductive portion 30 to be formed. Furthermore, it becomes easier for the upper conductor 24 and the conductive portion 30 to come in airtight contact, and the bonding strength is thus improved. Therefore, it becomes possible to prevent a problem that the conductive portion 30 is separated from the opening portion 28 by an external force. This kind of opening portion 28 will have a greater effect in a case where many such opening portions are formed in the base 22, because the method of the present invention is one that is capable of securely forming the conductive portion 30 in each opening portion 28 even when the opening portions 28 formed in a plural number in the base 22 are greatly uneven.

Figure 2:
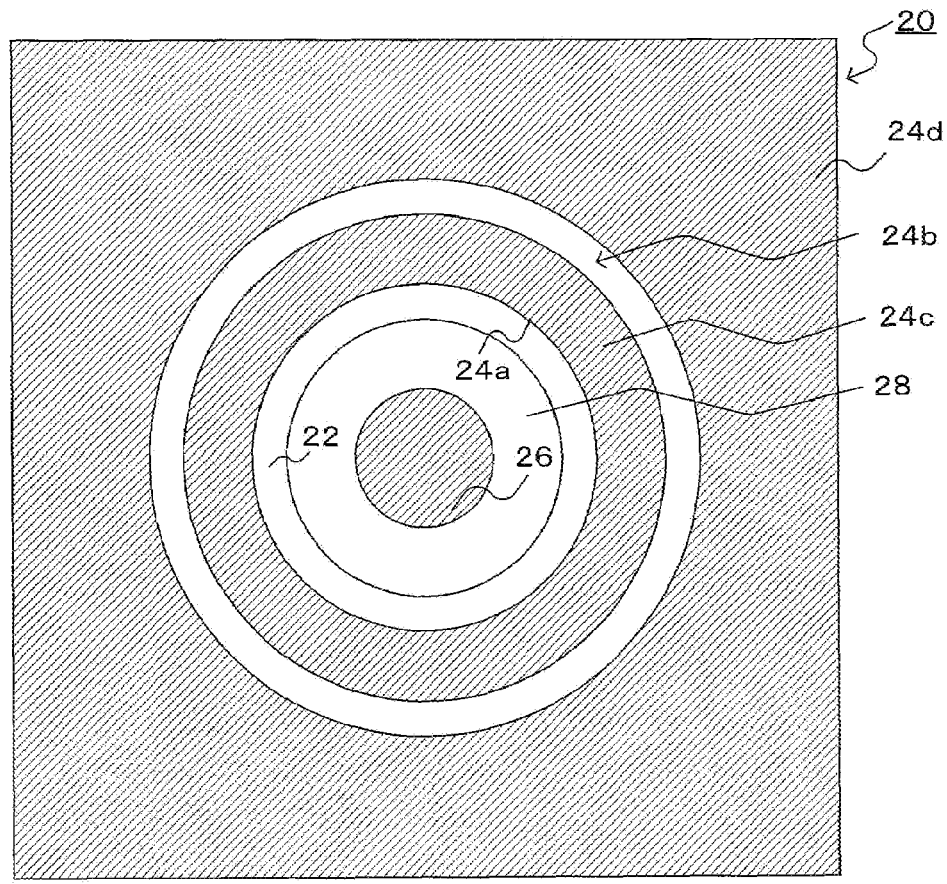
FIG. 2 is a plan view of the single-layer board of FIG. 1.

The upper conductor 24 is constituted by a conductor, and is formed on the base 22. FIG. 2 shows the plan view of the single-layer board 20. In order for the shape of the upper conductor 24 to be understood more easily, the conductive portion 30 and the conductive portion 36 are omitted from FIG. 2. As shown in FIG. 2, the upper conductor 24 has an opening 24a formed so as to penetrate through the upper conductor 24, and a groove 24b for an insulating purpose.

The opening 24a is formed at a position corresponding to the opening portion 28 of the base 22. According to the present embodiment, the opening portion 28 is formed to be smaller than the opening 24a in the upper conductor 24 and have a predetermined distance from the opening 24a in the upper conductor 24. For example, in a case where the opening 24a in the upper conductor 24 has a shape of a circle having a diameter of 260 μm, the opening portion 28 is formed to have its uppermost plane formed in the shape of a circle having a diameter of 160 μm, in a manner to penetrate through the base 22 from the upper surface of the base 22 exposed due to the opening 24a in the upper conductor 24 to have the lower conductor 26 exposed, and to have a predetermined distance from the opening 24a in the upper conductor 24.

The groove 24b is formed in the shape of a ditch penetrating the upper conductor 24, and forms (divides) the upper conductor 24 into a plurality of conductive portions which are electrically insulated. The groove 24b needs to be formed so as to divide the upper conductor 24 into a plurality of conductive portions, and is formed, for example, such that a first conductive portion surrounds the opening 24a (the opening 24a is included in the first conductive portion). According to the present embodiment, the groove 24b is formed like a doughnut shape to surround the circumference of the opening 24a, as shown in FIG. 2. Therefore, the upper conductor 24 is divided into a first conductive portion 24c having the opening 24a formed in the center, and a second conductive portion 24d formed so as to surround the first conductive portion 24c.

Here, it is preferred that the groove 24b be formed (by division) such that the conductive portion formed near the opening 24a will be as small as possible. In case of the present embodiment shown in FIG. 2, it is preferred that, for example, the first conductive portion 24c be formed (by division) to be smaller than the second conductive portion 24d by as much as possible. This is in order not to allow the current density to abruptly change even when the deposited plate contacts the first conductive portion 24c in a later-described process of forming the conductive portion 30. The groove 24b may be formed plurally, and may be formed in, for example a latticed shape.

Further, in a case where the groove 24b is filled with plate (in a case where the first conductive portion 24c and the second conductive portion 24d are electrically connected), it is preferred the groove 24b have a width of 2 t to 20 t where t is the thickness of the upper conductor 24, more preferably, a width of 4 t to 20 t. This is because, if the width of the groove 24b is smaller than 2 t, there is a risk that all the opening portions 28 might not be filled with plate, such that a groove 24b near an opening portion 28 filled with plate will be filled with plate (finished with plate deposition) faster than an opening portion 28 not yet filled with plate. The above width range is further because, if the width of the groove 24b exceeds 20 t, there is a risk that the groove 24b might not be filled with plate. For example, in a case where the thickness of the upper conductor 24 is 12 μm, it is preferred that the width of the groove 24b be about 24 μm to 240 μm, and more preferably about 48 μm to 240 μm.

Figure 5A:
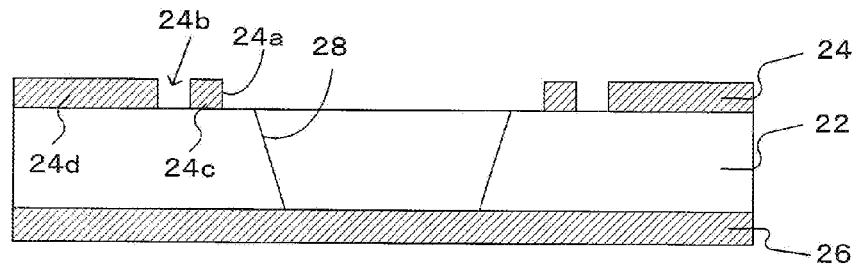
FIG. 5A to FIG. 5E are diagrams for explaining a manufacturing process of the single-layer board of FIG. 1.
Figure 5B:
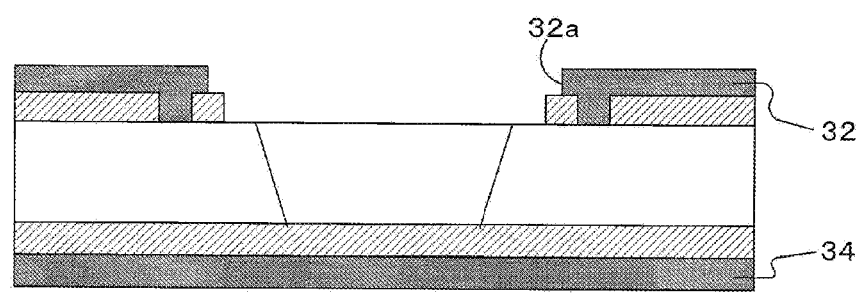
Figure 5C:
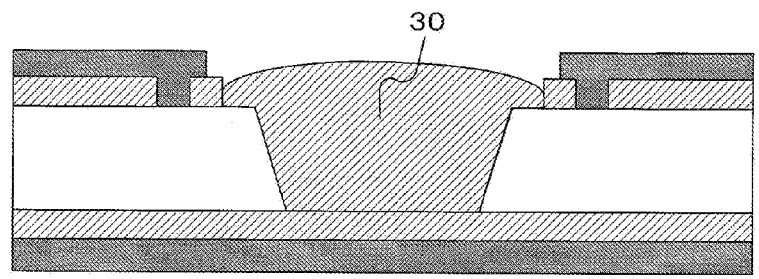

Note that in a case where the groove 24b is covered with, for example, a second insulating member so as not to be filled with plate as shown in FIG. 5C in a later-described manufacturing method of the substrate (in a case where the first conductive portion 24c and the second conductive portion 24d are not electrically connected), there is no particular preferred range of width for the groove 24b because the groove 24b is not to be filled with plate, and the width may therefore be, for example, larger than 20 t.

The lower conductor 26 is constituted by a conductor. The lower conductor 26 is formed on the entire lower surface of the base 22.

The conductive portion 30 is constituted by metal plate, and is formed inside the opening portion 28. The conductive portion 36 is constituted by metal plate, and is formed on the conductive portion 30 and the upper conductor 24. The conductive portion 30 and the conductive portion 36 are formed only by electroplating, without performing a pretreatment such as nonelectrolytic plating, etc. that requires a high cost of maintaining the solution and a high material cost for the solution. Therefore, as will be described later, the pretreatment process for nonelectrolytic plating, etc. becomes unnecessary when the conductive portion 30 and the conductive portion 36 are formed. As a result, shortening of the manufacturing process and a low-priced manufacturing can be achieved. Further, since the pretreatment process such as nonelectrolytic plating, etc. is not needed, it is possible to, for example, prevent a metal catalyst, used for improving the reaction speed in the nonelectrolytic plating, from remaining on the side of the wiring pattern, and thereby to improve the reliability of the electronic component. Further, since the upper conductor 24 and the conductive portion 30 can be the power feeding electrode for electroplating, the film thickness necessary for the wiring pattern (the thickness of the upper conductor 24 and conductive portion 36) can be secured by time management, etc. of electroplating.

After the single-layer board 20 constituted as described above has the bosses and recesses on the surface of the conductive portion 30 or the conductive portion 36 formed by electroplating polished and has the lower conductor 26, etc. patterned to form an electrode pattern, a multilayered board (electronic component) is formed by stacking the substrates etc. including the single-layer board 20. As described above, by filling the opening potion 28 with the plate and flattening the single-layer board 20, it is possible to attach an element to the substrate by flip-chip packaging, make the substrate suitable for multilayering, densifying, and downsizing, and make the substrate have a high radiation property and a high connection reliability. FIG. 3 and FIG. 4 show examples of electronic component.

Figure 3A:
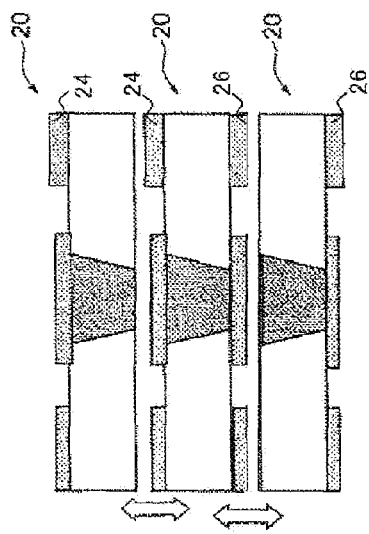
FIG. 3A to FIG. 3C are diagrams showing structures of electronic components formed by stacking the single-layer board of FIG. 1.
Figure 3B:
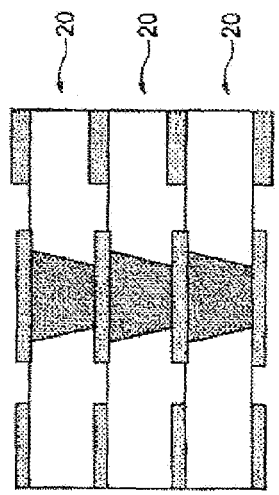
Figure 3C:
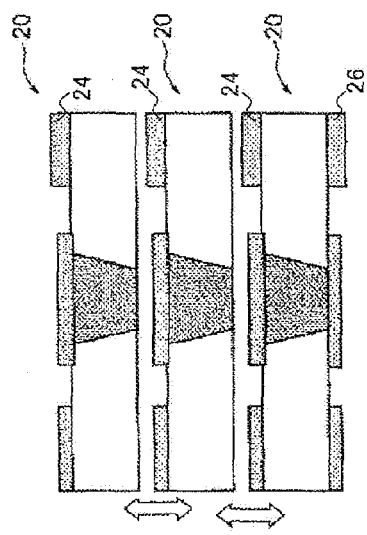

In FIG. 3A, two single-layer boards 20 on which no lower conductor 26 is formed are disposed on a lowermost single-layer board 20 on which the upper conductor 24 and the lower conductor 26 are formed. By stacking these boards by, for example, thermal compression bonding, an electronic component as shown in FIG. 3B is formed. In FIG. 3C, a single-layer board on which no lower conductor 26 is formed is disposed above a single-layer board 20 on which the upper conductor 24 and the lower conductor 26 are formed, and a single-layer board on which no upper conductor 24 is formed is disposed under the single-layer board 20. By stacking these boards by, for example, thermal compression bonding, an electronic component as shown in FIG. 3B is formed.

Figure 4A:
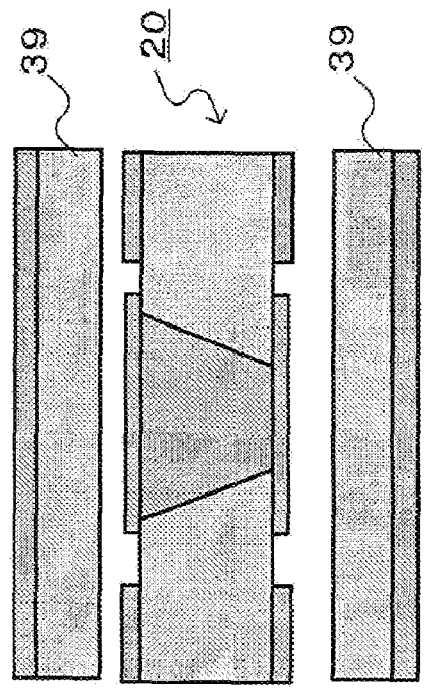
FIG. 4A and FIG. 4B are diagrams showing structures of other electronic components comprising the single-layer board of FIG. 1.
Figure 4B:
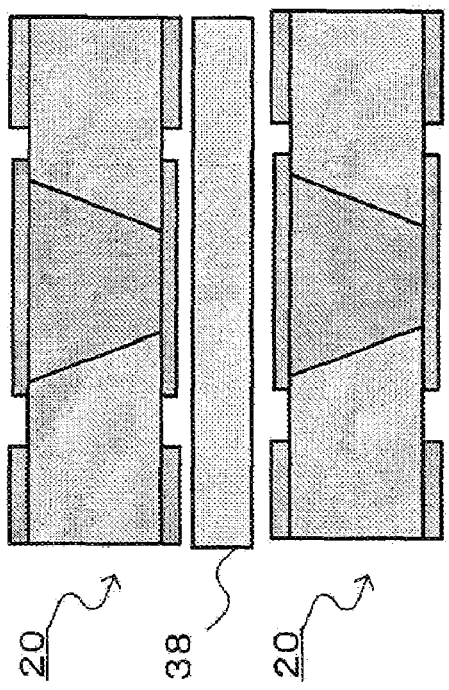

In FIG. 4A, an electronic component is formed by disposing a prepreg (adhesive sheet) 38 between two single-layer boards 20 on which the upper conductor 24 and the lower conductor 26 are formed, and adhering (stacking) the single-layer boards 20. Through holes may be used as the wiring between the substrates. In FIG. 4B, an electronic component is formed by adhering RCCs 39 to the upper and lower sides of a single-layer board 20 on which the upper conductor 24 and the lower conductor 26 are formed. That is, the single-layer board 20 is used as the center layer (core material), and wiring layers are stacked on both surfaces of the center layer (core material).

Next, a manufacturing method of the substrate and electronic component will be explained. FIG. 5 are diagrams for explaining the steps of manufacturing the single-layer board.

First, a base 22 having a predetermined thickness and made of an insulating material, on whose entire upper surface an upper conductor 24 is formed and on whose entire lower surface a lower conductor 26 is formed, is prepared. Next, for example, an etching process (photo etching) is performed while a resist (dry film) is disposed at predetermined regions on the upper conductor 24, thereby a predetermined number of circular openings 24a and doughnut-like grooves 24b are formed in the upper conductor 24. Due to this, the upper conductor 24 is divided into a first conductive portion 24c in which an opening 24a is formed, and a second conductive portion 24d disposed so as to surround the first conductive portion 24c.

The openings 24a, etc. are formed by an etching process as described above, because it will be seen to that opening portions 28 can be formed by later-described carbonic acid gas laser or the like at a low power output and with a small number of shots, and because of a consideration for the shape and positional accuracy of the opening portions 28. In this etching process, the upper conductor 24 is etched so that a shape, which is equal to or larger than the region where the opening portion 28 is to be formed, is formed.

Then, as described in Japanese Patent Application No. 2005-63464, a predetermined number of opening portions 28 are formed by removing the insulating material by applying blasting, laser processing, or plasma processing to predetermined regions of the base 22 that are exposed in the openings 24a of the upper conductor 24 (first conductive portions 24c) until the lower conductor 26 is exposed. In case of using laser processing, it is often the case that carbonic acid gas laser is used for processing an insulating member (base 22) made of an insulating material, while YAG laser (Yttrium Aluminum Garnet laser) is used for processing a conductor. However, there are some cases where carbonic acid gas laser is used for processing both the conductor and the insulating member. Therefore, in the case where these lasers are used, the etching process on the upper conductor 24 is not necessary for forming the openings 24a and the grooves 24b. Further, in the case where the different lasers are used, the conductor and the insulating member may be loaded on the same positioning mechanism to be processed consecutively, from the viewpoint of improving the processing efficiency.

Here, it is preferred that the opening portion 28 be formed to have its diameter increase from the lower surface side to upper surface side of the base 22. With this increasing diameter, it becomes easier for the plate to go into the opening portion 28 in the later-described filling of plate into the opening portion 28, and the chance of a void being produced inside a conductive portion 30 to be formed is reduced. Furthermore, it becomes easier for the upper conductor 24 and the conductive portion 30 to come into an airtight contact, thereby improving the bonding strength.

Further, the opening portion 28 is formed to be smaller than the opening 24a and to have a predetermined distance from the opening 24a. For example, the opening portion 28 is formed to have a circular shape having a diameter of 160 μm such that it has a distance of 50 μm from the opening 24a. The state of this opening portion 28 being formed is shown in FIG. 5A.

After the predetermined number of opening portions 28 are formed, for example, a desmear process using a chemical or an electrochemical smear removing process such as plasma processing is performed to clean the inside of the opening portion 28 and the inside-opening surface (the exposed surface exposed in the opening portion 28) of the lower conductor 26, as described in Japanese Patent Application No. 2005-63464. In a case where the opening portion 28 is formed by laser or the like, it is likely that organic matters and attachments that are carbonized or metalaized by the laser are present on the inner wall, etc. of the opening portion 28. If these are present, the insulating performance of the inner wall of the opening portion is decreased 28 and plate growth from the inner wall of the opening portion 28 will therefore become dominant in the later-described electroplating filling of the opening portion 28 with a conductive material. This will result in an insufficient deposition at the center of the opening portion 28 and hinder the performance of plate filling. Hence, according to the present embodiment, after the predetermined number of opening portions 28 are formed, the inside of the opening portions 28, etc. are cleaned.

Next, a mask 32 as a second insulating member, made of an insulating material, for example, a photosensitive resin or the like, is disposed on the upper conductor 24, etc., so that the metal plate to be filled in the opening portion 28 may not contact the second conductive portion 24d of the upper conductor 24. According to the present embodiment, the mask 32 is disposed so as to entirely cover the groove 24b and the second conductive portion 24d.

A hole 32a is formed in the mask 32 so that the opening portion 28 and a part of the first conductive portion 24c as the power feeding electrode for the later-described electroplating, are exposed. Further, a mask 34 made of an insulating material, for example, a photosensitive resin or the like, is also formed on the lower surface of the lower conductor 26. As a result, the state shown in FIG. 5B is achieved.

It is preferred that the opening portion 28, the exposed surface of the upper conductor 24, and the inside-opening surface (the exposed surface of the lower conductor 26 exposed in the opening portion 28) of the lower conductor 26 be treated with plasma or blasting, etc., before the later-described electroplating is performed.

Next, electroplating is performed by using the lower conductor 26 as an electroplating electrode (power feeding electrode). Metal to be deposited by the plating will grow from the lowermost position in the opening portion 28, i.e., the exposed surface of the lower conductor 26. Then, as the growth of the metal plate that starts from the lower conductor 26 continues, the inside of the opening portion 28 is filled with the metal plate and a conductive portion 30 is formed in the opening portion 28 as shown in FIG. 5C.

Here, since the upper conductor 24 is divided into the first conductive portion 24c and the second conductive portion 24d by the groove 24b, no abrupt change of the plating current density will occur even if the deposited plate reaches the uppermost layer of the substrate to come into contact with the first conductive portion 24c. Therefore, even if the number of opening portions 28 formed in the substrate is large and the opening portions 28 are greatly varied, filling of the plate can be stably performed. Accordingly, it is possible to provide a substrate and an electronic component having a high electric reliability. Furthermore, it is possible to fill the opening portion 28 with the plate efficiently.

Further, since the second conductive portion 24d is completely covered with the mask 32, the deposited plate and the second conductive portion 24d will not contact each other even when the deposited plate reaches the uppermost layer of the substrate. Therefore, there will be no chance that the plating current density changes abruptly. Therefore, even if the number of opening portions 28 formed in the substrate is large and the opening portions 28 are greatly varied, filling of the plate can be stably performed. Accordingly, it is possible to provide a substrate and an electronic component having a high electric reliability. Furthermore, it is possible to fill the opening portion 28 with the plate efficiently.

Furthermore, since the mask 34 is formed on the lower surface of the lower conductor 26 as described in Japanese Patent Application No. 2005-63464, the stress balance between the upper and lower sides of the substrate is maintained and the substrate can be prevented from breakage and deformation. In addition, since the lower conductor 26 can be exposed limited at the power feeding portion and the plated surface, damages to be received by the lower conductor 26 can be reduced. Furthermore, plate deposition can be stably performed in the opening portion 28. This is because, if the plating solution is adhered to the back surface (lower conductor 26), the current density in the opening portion 28 will decrease and plate deposition might not be performed stably in the opening portion 28.

Figure 5D:
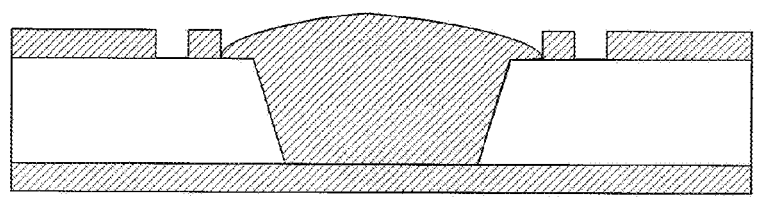

When all the opening portions 28 are filled with the plate and the conductive portions 30 are formed in the opening portions 28, the mask 32 is separated from the upper conductor 24. Further, the mask 34 is separated from the lower conductor 26. As a result, the state shown in FIG. 5D is achieved.

Figure 5E:
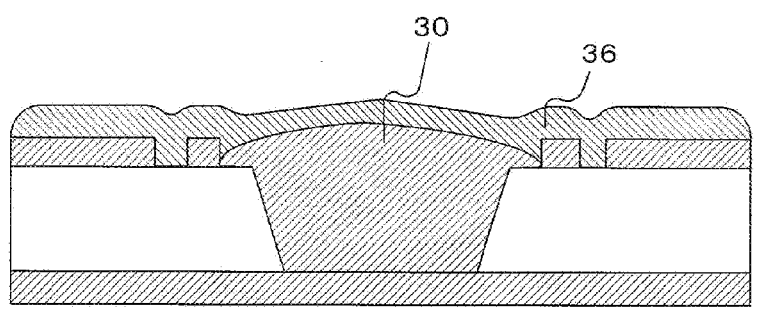
Figure 8A:
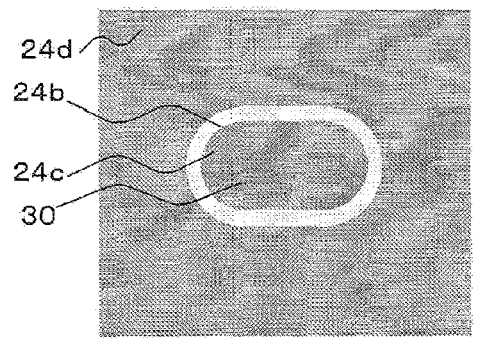
FIG. 8A to FIG. 8H are diagrams showing other examples of groove.
Figure 8B:
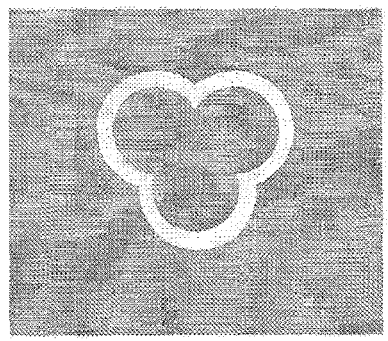
Figure 8C:
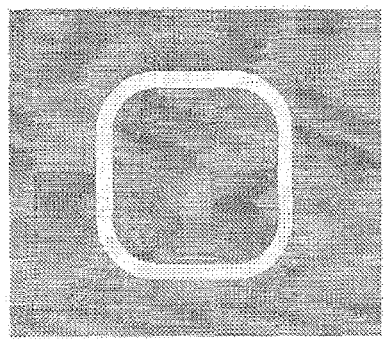
Figure 8D:
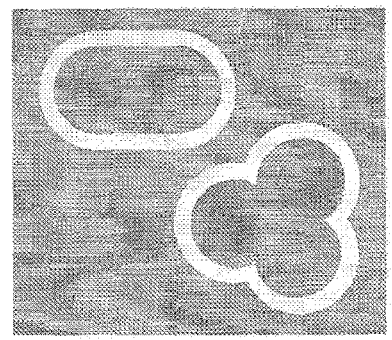
Figure 8E:
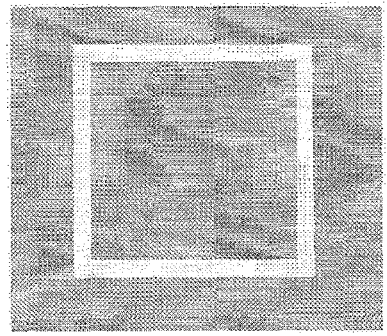
Figure 8F:
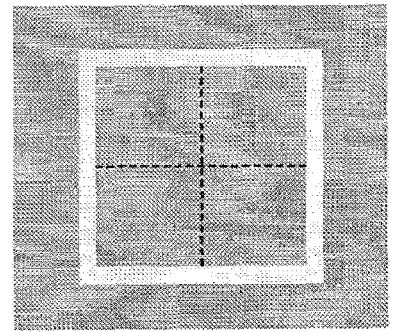
Figure 8G:
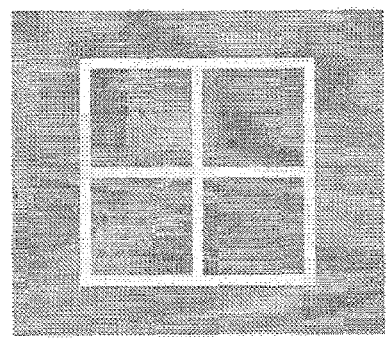
Figure 8H:
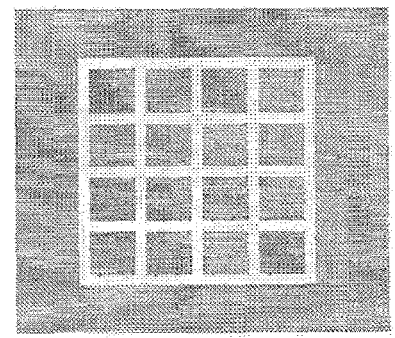

Next, electroplating is performed by using the first conductive portion 24c of the upper conductor 24 as the electroplating electrode (power feeding electrode). As shown in FIG. 5E, metal (conductive portion 36) to be deposited by the plating will conductively join the filled conductor (conductive portion 30) at the upper surface of the opening portion 28 with the upper conductor 24 (first conductive portion 24c), and conductively join the first conductive portion 24c with the second conductive portion 24d by filling the groove 24b. As a result, interlayer connection is achieved. Note that electroplating may be performed by using the lower conductor 26 as the power feeding electrode. Also in this case, the conductive portion 30 and the upper conductor 24 can be conductively joined, likewise the case where the upper conductor 24 is used as the electroplating electrode. The height of the conductive portion 30 can be controlled in accordance with plating conditions and solution constitution.

As described above, since the plate (conductive portion 30) and the plate (conductive portion 36) above the opening portion 28 can be independently deposited (formed), it is possible to make the plate-filled portion free from a void, stabilize the deposition height, and obtain conductive joining between the conductor layers with favorable filling.

Further, since nonelectrolytic plating step is not performed, it is possible to achieve simplification of the manufacturing steps. Furthermore, it is possible to prevent a metal catalyst, which is used for improving the reaction speed of the non-electrolytic plating process, from remaining on the side of the wiring pattern, and to improve the electric reliability of the electronic component. Moreover, in forming a desired pattern in the upper conductor 24, the pattern etching performance is not decreased. This gives the upper conductor 24 a better dimensional accuracy, and can make the dimensional accuracy of the wiring better than conventional. Therefore, narrowing of the tolerance of circuit constants of an electronic component can easily be realized. Further, a pattern with narrow wiring widths can be formed. As a result, it becomes possible to deal with wiring patterns for realizing a higher frequency.

Next, as described in Japanese Patent Application No. 2005-63464, the bosses and recesses of the plates (conductive portion 30, conductive portion 36) protruding upward from the single-layer board 20 are polished, thereby the substrate shown in FIG. 1 can be manufactured. Further, it is possible to manufacture such an electronic component as shown in FIG. 3B, by applying a predetermined patterning to the lower conductor 26, etc. to form an electrode pattern, and as shown in FIG. 3A, by disposing two single-layer boards 20 on which no lower conductor 26 is formed, above the single-layer board 20 having the electrode pattern formed, and thermo-compressively bonding these boards, provided that a thermoplastic resin is used as the insulating layer.

As explained above, according to the present embodiment, after the upper conductor 24 is divided into the first conductive portion 24c and the second conductive portion 24d, electroplating is performed by using the lower conductor 26 as the power feeding electrode, to fill the opening portion 28 with plate. Therefore, even when the deposited plate contacts the first conductive portion 24c, the plating current density will not abruptly change. Therefore, even if the number of opening portions 28 formed in the substrate is large and the unevenness among the opening portions 28 is great, it is possible to stably perform plate filling. Accordingly, it is possible to provide a substrate and an electronic component having a high electric reliability. Further, it is possible to efficiently fill the opening portions 28 with plate.

Further, according to the present embodiment, since the step for nonelectrolytic plating, etc. can be omitted, simplification of the manufacturing steps can be achieved. Furthermore, when a desired pattern is formed in the upper conductor 24, the pattern etching performance is not decreased. Therefore, the dimensional accuracy of the upper conductor 24 can be improved.

Furthermore, according to the present embodiment, since the second conductive portion 24d is completely covered with the mask 32, even when the deposited plate reaches the uppermost layer of the substrate, the deposited plate and the second conductive portion 24d do not contact each other. Therefore, the plating current density is not abruptly changed, and plate filling can be performed further stably.

Moreover, according to the present embodiment, plate deposition (formation) can be performed independently for the conductive portion 30 and the conductive portion 36. Therefore, it is possible to make the plate-filled portion free of a void, to stabilize the deposition height, and to achieve conductive joining between the conductor layers with a favorable filling. Accordingly, it is possible to improve the electric reliability of the electronic component.

The present invention is not limited to the above-described embodiment, but can be modified or applied in various manners. Other embodiments applicable to the present invention will be explained below.

In the above-described embodiment, the present invention was explained by employing, as an example, a case where the plate is filled in the opening portion 28 by placing the mask 32 so as to completely cover the groove 24b and the second conductive portion 24d and performing electroplating by using the lower conductor 26 as the power feeding electrode. However, it is only needed that after the upper conductor 24 is divided, electroplating be performed to fill the opening portion 28 with plate, by using the lower conductor 26 as the power feeding electrode. Thus, the mask 32 may not be placed. Also in this case, the plating current density does not change abruptly, and plate filling can be performed stably.

Further, it is only needed that the mask 32 be formed such that the conductor to be filled in the opening portion 28 may not contact the second conductive portion 24d. Thus, as shown in FIG. 6A, for example, a ring-shaped mask 41 may be placed on the first conductive portion 24c, and a mask 42 may be placed on the second conductive portion 24d. In this case, the opening portion 28 is filled with metal plate as shown in FIG. 6B by performing electroplating by using the lower conductor 26 as the electroplating electrode (power feeding electrode), and the plated conductor (conductive portion 30) and the upper conductor 24 (first conductive portion 24c and second conductive portion 24d) are conductively joined as shown in FIG. 6C and FIG. 6D by performing electroplating by using the first conductive portion 24c as the electroplating electrode (power feeding electrode).

In the above-described embodiment, the present invention was explained by employing, as an example, a case where the opening portion 28 is formed to have a smaller diameter than that of the opening 24a, and a predetermined distance is kept between the opening portion 28 and the opening 24a. However, the diameter of the opening portion 28 and that of the opening 24a may be the same, as shown in FIG. 7. Also in this case, by placing the mask 32 so as not to allow the metal plate to contact the divided second conductive portion 24d, it is possible to fill the opening portion 28 continuously at a stable speed.

In the above-described embodiment, the present invention was explained by employing, as an example, a case where one groove 24b is formed so as to surround one opening 24a (opening portion 28). It is only needed that the groove 24b be formed so as to divide the upper conductor 24 into a plurality of conductive portions. This is because the plating current density does not easily change if the upper conductor is divided into a plurality of conductive portions.

For example, a predetermined number of grooves 24b may be formed so as to surround a plurality of openings 24a as shown in FIG. 8A to FIG. 8H, or a plurality of grooves 24b may be formed such that the substrate may be divided into electronic component units.

Figure 9A:
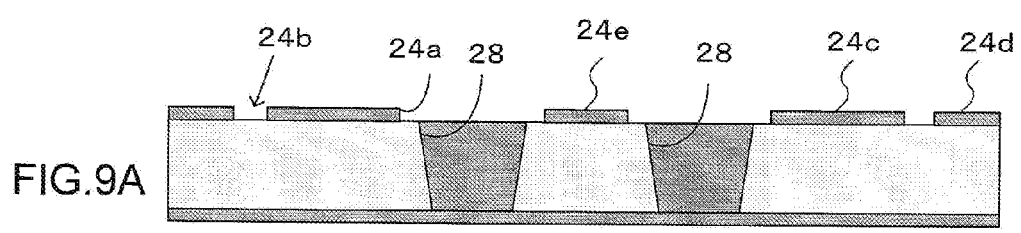
FIG. 9A to FIG. 9D are diagrams for explaining a manufacturing process of a single-layer board according to another embodiment.
Figure 9B:
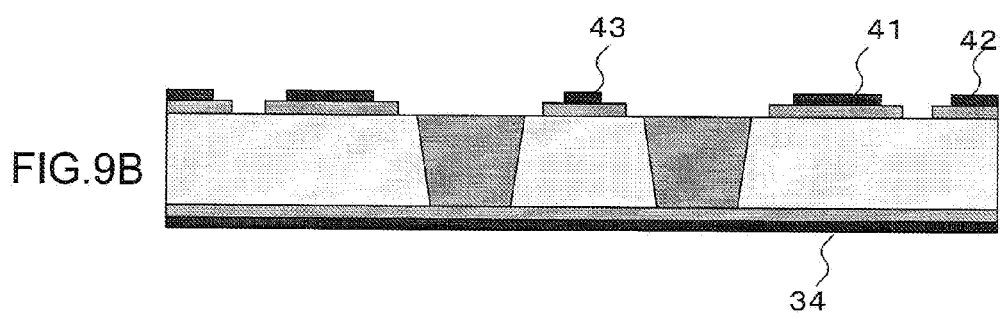
Figure 9C:
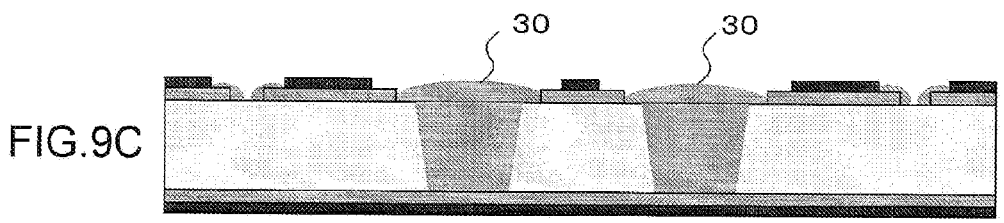
Figure 9D:
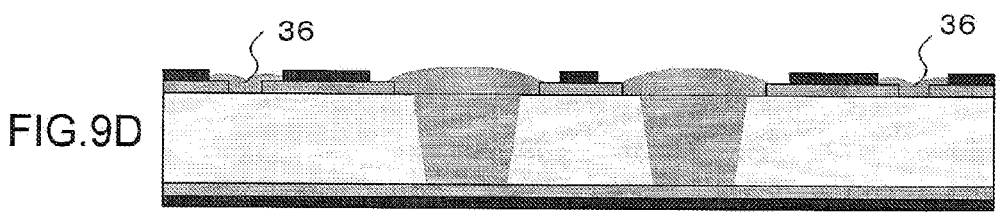

FIG. 9A shows the structure of the single-layer board 20 in a case where one groove 24b is formed so as to surround two openings 24a (opening portions 28). In this case, for example, by placing a ring-shaped mask 41 on the first conductive portion 24c, a mask 42 on the second conductive portion 24d, and a mask 43 on a conductive portion 24e as shown in FIG. 9B, and performing electroplating by using the lower conductor 26 as the electroplating electrode (power feeding electrode), the opening portions 28 are filled with metal plate as shown in FIG. 9C, and by performing electroplating by using the first conductive portion 24c as the electroplating electrode (power feeding electrode), the plated conductor (conductive portion 30) and the upper conductor 24 (first conductive portion 24c to conductive portion 24e) are conductively joined as shown in FIG. 9D.

Figure 10:
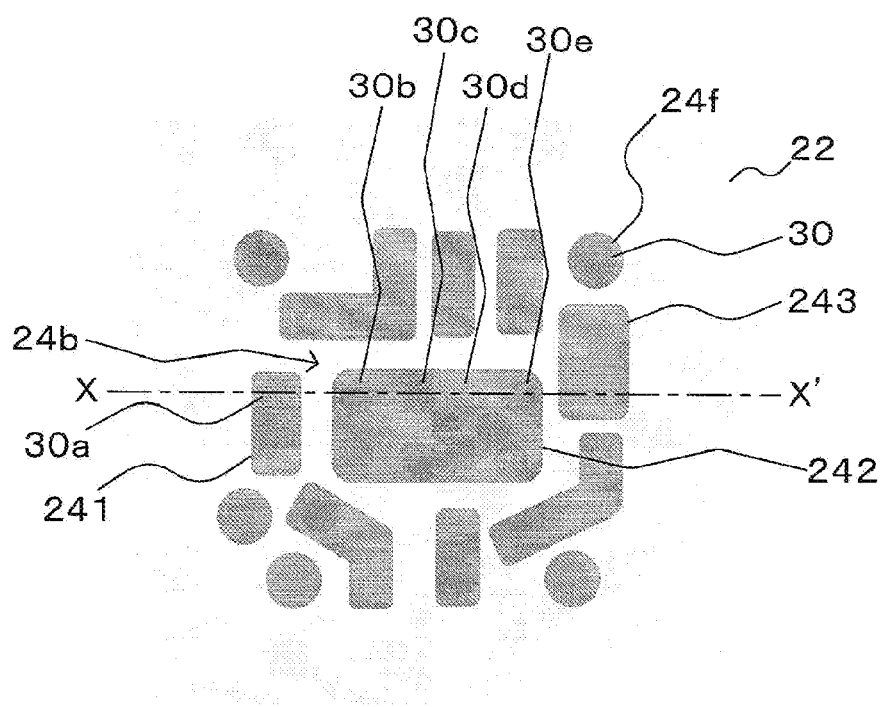
FIG. 10 is a diagram showing another example of a single-layer board.

Further, a groove 24b may be formed in the upper conductor 24 such that a plurality of conductive portions 24f to be formed on the base 22 may have a desired wiring pattern as shown in FIG. 10. In this case, there is no need of further forming a pattern as the wiring pattern in the manufacturing process of the substrate, making it possible to further simplify the manufacturing process of the substrate. The manufacturing process of the substrate (single-layer board) shown in FIG. 10 will be explained with reference to FIG. 11 and FIG. 12. FIG. 11 and FIG. 12 are diagrams showing the manufacturing steps of the substrate, at the X-X cross section of FIG. 10.

Figure 11A:
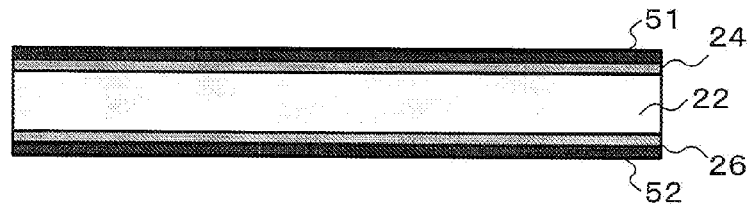
FIG. 11A to FIG. 11G are diagrams for explaining a manufacturing process of the single-layer board of FIG. 10.
Figure 11B:
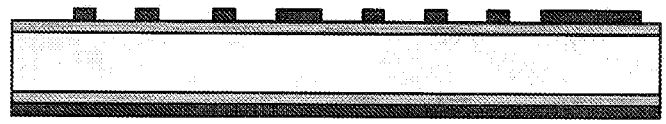
Figure 11C:
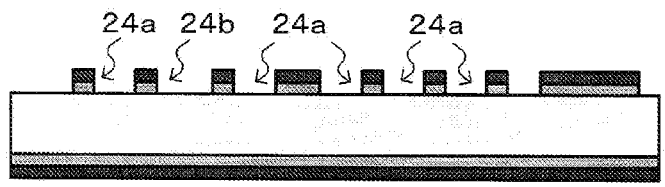

First, on a base 22 on which an upper conductor 24 and a lower conductor 26 are stacked, a dry film 51 is placed on the upper conductor 24 and a dry film 52 is placed on the lower conductor 26, as shown in FIG. 11A. Next, the dry film 51 is exposed and developed to be a shape corresponding to the wiring pattern as shown in FIG. 11B and etching is performed by using the dry film 51 as a mask, thereby openings 24a and a groove 24b are formed at predetermined positions as shown in FIG. 11C. Here, since no opening portion 28 is to be formed under a conductive portion 243 as shown in FIG. 10, the conductive portion 243 is formed as the groove 24b is formed.

Figure 11D:
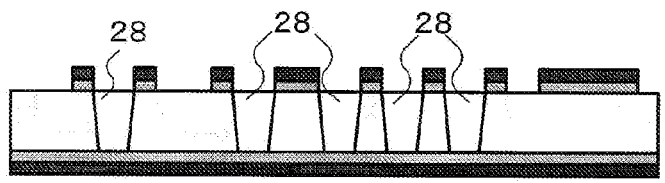
Figure 11E:
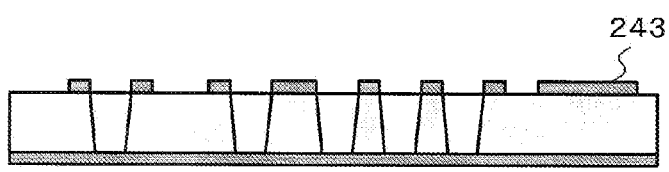
Figure 11F:
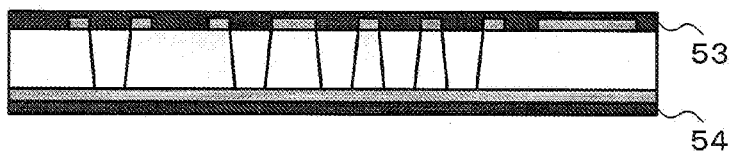
Figure 11G:
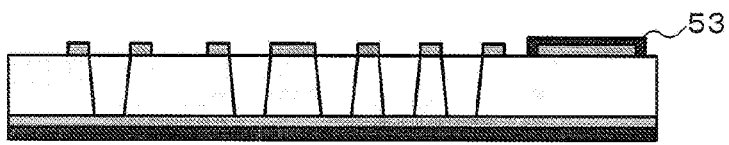

Then, predetermined regions of the base 22 that are exposed in the openings 24a are subjected to laser processing or plasma processing to remove the insulating material until the lower conductor 26 is exposed, thereby opening potions 28 are formed as shown in FIG. 11D. Next, the dry films 51 and 52 are removed as shown in FIG. 11E, and attachments on the opening portions 28 are removed by desmear processing, processing by a chemical, or plasma processing, etc. Then, a dry film 53 is placed on the upper conductor 24 and a dry film 54 is placed on the lower conductor 26 as shown in FIG. 11F. The dry film 53 is exposed and developed, to cover the conductive portion 243 with the dry film 53 as shown in FIG. 11G. Here, the circumference of the conductive portion 243 may be covered with the dry film 53.

Next, electroplating is performed by using the lower conductor 26 as the electroplating electrode, to form conductive portions 30 (30a to 30e) in the opening portions 28 as shown in FIG. 12A. Further, after electroplating is performed until the conductive portions 30 (30a to 30e) and the upper conductor 24 therearound contact each other as shown in FIG. 12B, the dry films 53 and 54 are removed. Thus, conductive portions 241 to 243 are formed on the base 22, as shown in FIG. 12C. Then, a dry film 55 is placed on the upper conductor 24 and a dry film 56 is placed on the lower conductor 26 as shown in FIG. 12D, and the dry film 56 is exposed and developed in accordance with the shape of the lower conductor 26 as shown in FIG. 12E. Then, after etching is performed by using the dry film 56 as a mask as shown in FIG. 12F, the dry films 55 and 56 are removed. Thus, the substrate can be manufactured as shown in FIG. 12G.

Figure 13A:
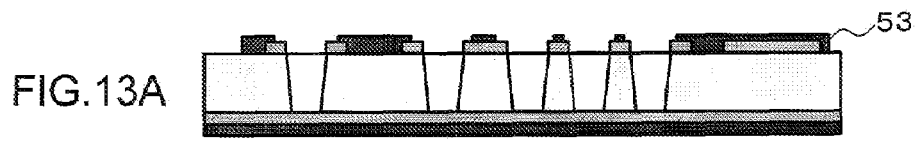
FIG. 13A to FIG. 13D are diagrams for explaining another manufacturing process of the single-layer board of FIG. 10.
Figure 13B:
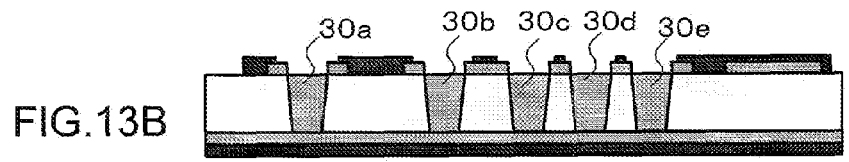
Figure 13C:
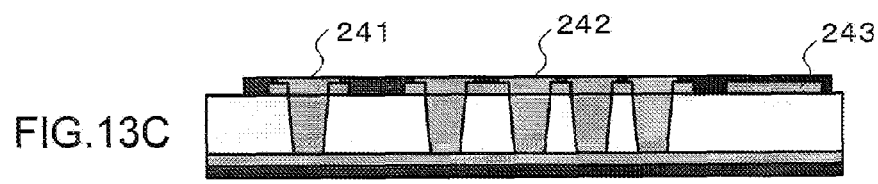
Figure 13D:
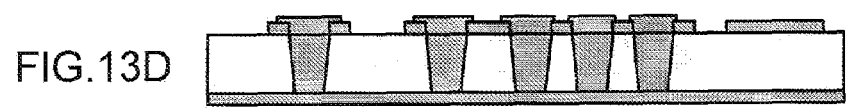

Alternatively, the dry film 53 being in the state shown in FIG. 11F may be exposed and developed to form the dry film 53 on the conductive portion 243 and the groove 24b, and around the opening portions 28 as shown in FIG. 13A. In this case, conductive portions 241 to 243 can be formed on the base 22 as shown in FIG. 13B to FIG. 13D, in accordance with similar procedures to those shown in FIG. 12A to FIG. 12C. Further, a substrate can be manufactured in accordance with similar procedures to those shown in FIG. 12D to FIG. 12G. Note that the upper surfaces of the conductive portions 241 and 242 being in the state shown in FIG. 13C may be polished so that the upper surfaces of the conductive portions 241 and 242 may be flattened.

Figure 14A:
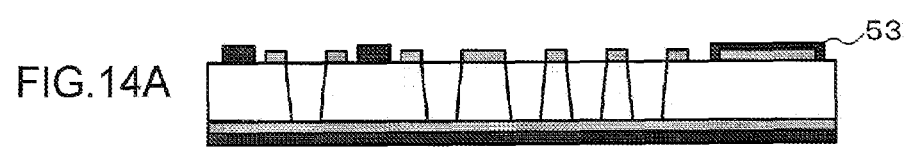
FIG. 14A to FIG. 14D are diagrams for explaining another manufacturing process of the single-layer board of FIG. 10.
Figure 14B:
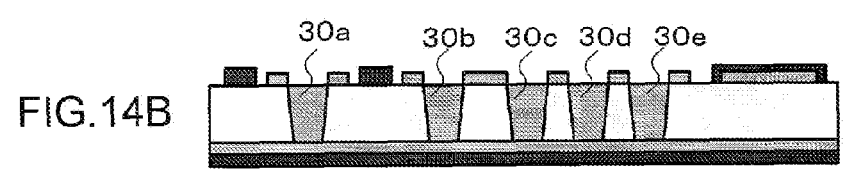
Figure 14C:
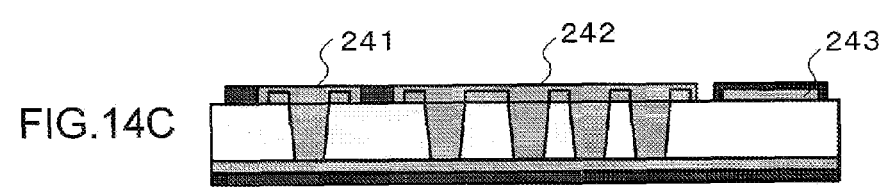
Figure 14D:
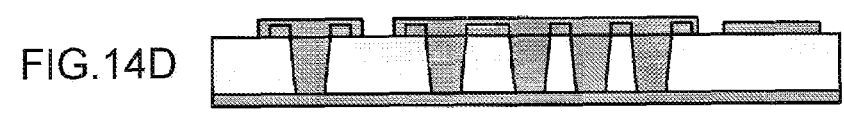

The dry film 53 being in the state shown in FIG. 11F may be exposed and developed to form the dry film 53 on the conductive portion 243 and between the conductive portion 241 and the conductive portion 242 as shown in FIG. 14A. Also in this case, the conductive portions 241 to 243 can be formed on the base 22 as shown in FIG. 14B to FIG. 14D, in accordance with similar procedures to those shown in FIG. 12A to FIG. 12C. Further, a substrate can be manufactured in accordance with similar procedures to those shown in FIG. 12D to FIG. 12G.

Figure 15A:
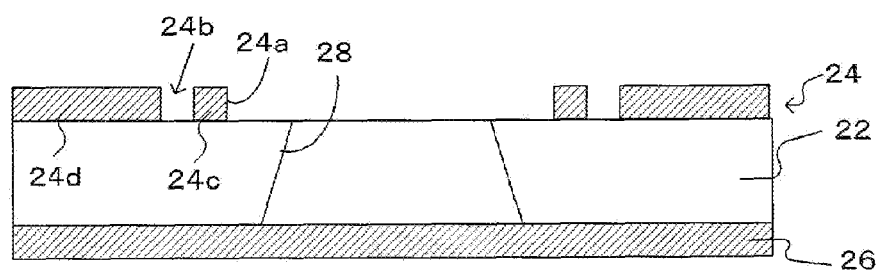
FIG. 15A and FIG. 15B are diagrams showing other examples of an opening portion.
Figure 15B:
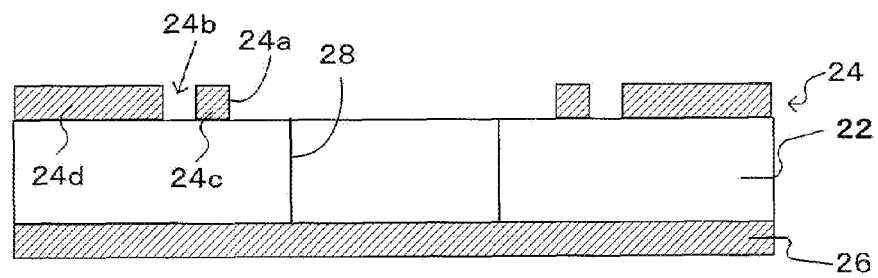
Figure 16A:
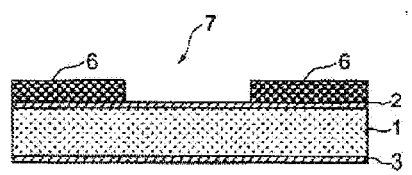
FIG. 16A to FIG. 16D are diagrams for explaining a manufacturing process of a conventional single-layer board.
Figure 17A:
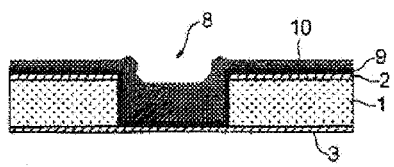
FIG. 17A to FIG. 17C are diagrams for explaining the manufacturing process of the conventional single-layer board.
Figure 16B:
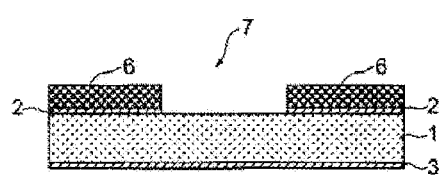
Figure 17B:
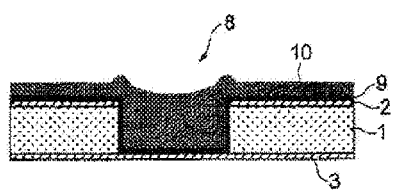
Figure 16C:
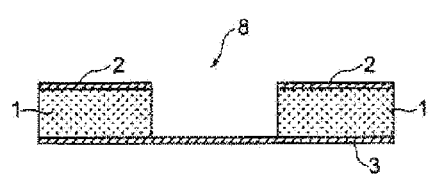
Figure 17C:
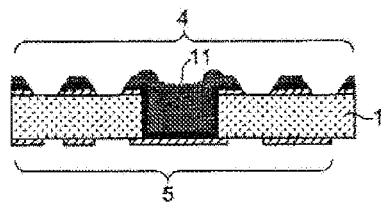
Figure 16D:
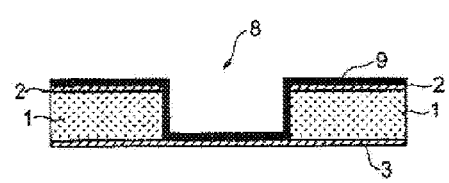

In the above-described embodiment, the present invention was explained by employing, as an example, a case where the opening portion 28 is formed to have a diameter that increases from the side of the lower conductor 26 toward the upper conductor 24. However, for example, the opening portion 28 may be formed so as to have its diameter increase from the side of the upper conductor 24 toward the lower conductor 26, as shown in FIG. 15A. Further, the opening portion 28 may not have its diameter change, as shown in FIG. 15B.

In the above-described embodiment, the present invention was explained by employing, as an example, a case where the upper conductor 24 is formed above the base 22 while the lower conductor 26 is arranged under the base 22. This arrangement may be reversed.

The present invention can be applied to various types of substrates and electronic components. For example, the present invention can be applied to low temperature co-fired ceramic (LTCC). As an application example of this case, a through hole of a low temperature co-fired ceramic substrate may be formed by using the manufacturing method of the substrate according to the present invention. Further, as an application example for a more preferred electronic component (multilayered substrate) using a low temperature co-fired ceramic substrate, for example, a multilayered substrate can be formed by using a conventional low temperature co-fired ceramic substrate as the core layer, and adhering the substrate of the present invention as the superficial layer.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

The present invention claims priority to Japanese Patent Application No. 2005-154087 filed on May 26, 2005, and incorporates the contents of the specification, claims, abstract, and drawings of the above application, and those of Japanese Patent Application No. 2005-63464.

What is claimed is:

1. A substrate, comprising:
   a first conductive member, comprising a plurality of conductive portions electrically insulated from each other by an insulating groove;
   a second conductive member; and
   a first insulating member, sandwiched between said first conductive member and said second conductive member, having an opening formed therethrough through said first conductive member to a side of said second conductive member, the side of said second conductive member having electroplating directly thereon with a thickness greater than a depth of said opening and with a width sufficient to completely fill said opening, the side of said second conductive member and all sidewalls of said opening being completely free of non-electrolytic chemical plating such that the electroplating directly contacts the side of said second conductive member and all sidewalls of said opening;
   wherein the plurality of conductive portions have electroplating directly thereon electrically connecting the plurality of conductive portions to the electroplating on the side of said second conductive member, the electroplating on the plurality of conductive portions filling the groove and having a substantially uniform thickness above the insulating member and the opening.

2. The substrate according to claim 1,
   wherein said first conductive member comprises a first conductive portion formed by said groove surrounding said opening in said first conductive member, and a second conductive portion that does not include said opening of said first conductive member.

3. The substrate according to claim 2,
   wherein said second conductive portion is formed so as to surround said first conductive portion.

4. The substrate according to claim 2,
   wherein said first conductive portion is formed so as to be smaller than said second conductive portion.

5. The substrate according to claim 1,
wherein said first conductive member is formed such that said plurality of conductive portions to be formed have a wiring pattern.

6. An electronic component, comprising substrates stacked together, each substrate comprising a first conductive member, a second conductive member, and a first insulating member sandwiched between said first and second conductive members, wherein each substrate further comprises:
- an opening formed through said first conductive member and through said first insulating member to a side of said second conductive member;
- said first conductive member comprises a plurality of conductive portions which are electrically insulated from each other by an insulating groove;
- wherein the side of said second conductive member has electroplating directly thereon with a thickness greater than a depth of said opening and with a width sufficient to completely fill said opening, the side of said second conductive member and all sidewalls of said opening being completely free of non-electrolytic chemical plating such that the electroplating directly contacts the side of said second conductive member and all sidewalls of said opening; and
- wherein the plurality of conductive portions have electroplating directly thereon electrically connecting the plurality of conductive portions to the electroplating on the side of said second conductive member, the electroplating on the plurality of conductive portions filling the groove and having a substantially uniform thickness above the insulating member and the opening.

* * * * *